US011935700B2

(12) United States Patent
Saito et al.

(10) Patent No.: US 11,935,700 B2
(45) Date of Patent: Mar. 19, 2024

(54) LAMINATED ELECTRONIC COMPONENT WITH DIFFERING GLASS CONTENT ELECTRODES

(71) Applicant: TDK CORPORATION, Tokyo (JP)

(72) Inventors: Noriyuki Saito, Tokyo (JP); Osamu Hirose, Tokyo (JP); Toru Yoshida, Tokyo (JP); Yoshinori Sato, Tokyo (JP); Akira Suda, Tokyo (JP); Akira Nakamura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 100 days.

(21) Appl. No.: 17/700,608

(22) Filed: Mar. 22, 2022

(65) Prior Publication Data

US 2022/0319777 A1    Oct. 6, 2022

(30) Foreign Application Priority Data

Mar. 31, 2021    (JP) .................................. 2021-059936

(51) Int. Cl.
*H01G 4/232* (2006.01)
*H01G 4/30* (2006.01)
*H05K 1/03* (2006.01)
*H05K 1/05* (2006.01)

(52) U.S. Cl.
CPC ............. *H01G 4/2325* (2013.01); *H01G 4/30* (2013.01); *H05K 1/0306* (2013.01); *H05K 1/053* (2013.01)

(58) Field of Classification Search
None
See application file for complete search history.

(56) References Cited

U.S. PATENT DOCUMENTS 5,378,662 A * 1/1995 Tsuyuki .................. C03C 3/253
501/64
5,624,741 A * 4/1997 Scott .................... H05K 3/4061
428/209

(Continued)

FOREIGN PATENT DOCUMENTS

CN    1241284 A  *  1/2000  ............. H01C 1/142
CN    1510703 A  *  7/2004  ............. B32B 18/00

(Continued)

OTHER PUBLICATIONS

WO2008035727_English_Translation (Year: 2008).*

*Primary Examiner* — Timothy J. Dole
*Assistant Examiner* — Muhammed Azam
(74) *Attorney, Agent, or Firm* — Oliff PLC

(57) ABSTRACT

A laminated electronic component includes an element body formed by laminating an insulating layer and having a bottom surface used as a mounting surface, and a bottom surface electrode formed on the bottom surface of the element body and containing glass and a sintered metal. The bottom surface electrode includes a first electrode layer and a second electrode layer formed on the element body side from the first electrode layer, an edge portion of the second electrode layer is covered with an overcoat layer which is a part of the element body, the first electrode layer is laminated on the second electrode layer with the overcoat layer interposed therebetween, and a content of glass in the first electrode layer is larger than a content of glass in the second electrode layer.

5 Claims, 11 Drawing Sheets

(56) References Cited

U.S. PATENT DOCUMENTS

| | | | | |
|---|---|---|---|---|
| 5,948,536 | A * | 9/1999 | Suzuki | H01L 23/642 428/432 |
| 6,477,031 | B1 * | 11/2002 | Hayashi | H05K 3/246 361/321.1 |
| 10,510,488 | B2 * | 12/2019 | Yasuda | H01G 4/012 |
| 2002/0057174 | A1 * | 5/2002 | Uchikoba | H01F 41/041 336/200 |
| 2003/0137477 | A1 * | 7/2003 | Dances | G02B 26/026 345/87 |
| 2003/0213614 | A1 * | 11/2003 | Furusawa | H05K 3/125 257/E21.174 |
| 2004/0217455 | A1 * | 11/2004 | Shiono | H05K 3/426 257/E23.069 |
| 2005/0219774 | A1 * | 10/2005 | Yoshikawa | H05K 3/4629 361/3 |
| 2009/0219670 | A1 * | 9/2009 | Takahashi | H01G 13/00 427/79 |
| 2010/0038120 | A1 * | 2/2010 | Kojima | H01G 4/232 156/89.12 |
| 2010/0071949 | A1 * | 3/2010 | Murakami | H01G 2/06 174/257 |
| 2011/0051314 | A1 * | 3/2011 | Sakurai | H01G 4/30 361/321.1 |
| 2013/0120898 | A1 * | 5/2013 | Park | H01G 4/30 252/514 |
| 2016/0225517 | A1 * | 8/2016 | Choi | H01F 17/0013 |
| 2016/0372265 | A1 * | 12/2016 | Hattori | H01G 4/005 |
| 2017/0103842 | A1 * | 4/2017 | Nagai | H01F 27/255 |
| 2017/0309389 | A1 * | 10/2017 | Sato | H01F 41/041 |
| 2018/0102217 | A1 * | 4/2018 | Fukunaga | H01G 4/232 |
| 2018/0337001 | A1 * | 11/2018 | Tozawa | H01F 17/0013 |
| 2019/0189333 | A1 * | 6/2019 | Kido | H01F 27/2804 |
| 2019/0214187 | A1 * | 7/2019 | Imada | H01F 17/0013 |
| 2019/0214188 | A1 * | 7/2019 | Imada | H01F 27/24 |
| 2019/0326130 | A1 * | 10/2019 | Mobley | H01B 1/22 |
| 2019/0348212 | A1 * | 11/2019 | Tozawa | H01F 27/29 |
| 2019/0355518 | A1 * | 11/2019 | Harada | H01G 4/30 |
| 2019/0378646 | A1 * | 12/2019 | Sukegawa | H01F 27/06 |
| 2020/0111603 | A1 * | 4/2020 | Sato | H01F 27/255 |
| 2021/0027937 | A1 * | 1/2021 | Sano | C03C 17/3411 |
| 2021/0027945 | A1 * | 1/2021 | Takahashi | H01G 4/2325 |
| 2021/0358683 | A1 * | 11/2021 | Inui | H01F 27/2823 |
| 2021/0375527 | A1 * | 12/2021 | Shimoyasu | H01F 17/0013 |
| 2022/0102062 | A1 * | 3/2022 | Wakabayashi | H01G 4/30 |
| 2022/0208464 | A1 * | 6/2022 | Lee | H01G 4/008 |
| 2022/0301763 | A1 * | 9/2022 | Teshigawara | H01F 27/29 |

FOREIGN PATENT DOCUMENTS

| | | | | |
|---|---|---|---|---|
| CN | 1585589 | A * | 2/2005 | ....... H01L 23/49816 |
| CN | 101783243 | A * | 7/2010 | ............. H01G 4/232 |
| CN | 103996537 | A * | 8/2014 | ............. H01G 4/005 |
| CN | 107068404 | A * | 8/2017 | ............... H01G 2/06 |
| CN | 107331508 | A * | 11/2017 | ......... H01F 17/0013 |
| CN | 104412381 | B * | 1/2018 | ....... H01L 27/14618 |
| CN | 108133810 | A * | 6/2018 | ............. H01F 17/04 |
| CN | 109920644 | A * | 6/2019 | ........... H01G 4/0085 |
| CN | 113903546 | A * | 1/2022 | ......... H01F 27/2804 |
| DE | 102008026710 | A1 * | 12/2008 | ............... H01B 1/02 |
| EP | 0396806 | A1 * | 11/1990 | |
| EP | 0412259 | A2 * | 2/1991 | |
| EP | 0893419 | A1 * | 1/1999 | |
| JP | H07105717 | A * | 4/1995 | |
| JP | 2000058377 | A * | 2/2000 | ............. C04B 35/465 |
| JP | 2001023822 | A * | 1/2001 | ......... H01F 17/0013 |
| JP | 2009170599 | A * | 7/2009 | ............. H01G 4/232 |
| JP | 2009239205 | A * | 10/2009 | ............... H01G 2/06 |
| JP | WO2008099772 | A1 * | 5/2010 | |
| JP | 2013123024 | A * | 6/2013 | ............. H01B 1/22 |
| JP | 2020-061409 | A | 4/2020 | |
| KR | 970029934 | A * | 6/1997 | |
| KR | 20020011120 | A * | 2/2000 | |
| KR | 100449623 | B1 * | 9/2004 | |
| KR | 20070026240 | A * | 3/2007 | |
| KR | 20090051627 | A * | 5/2009 | |
| KR | 20090053853 | A * | 5/2009 | |
| KR | 20150008632 | A * | 1/2015 | |
| KR | 20150053188 | A * | 5/2015 | |
| KR | 101828991 | B1 * | 3/2018 | |
| KR | 20180038224 | A * | 4/2018 | |
| KR | 20180065008 | A * | 6/2018 | |
| KR | 101949442 | B1 * | 2/2019 | |
| KR | 20200031307 | A * | 3/2020 | |
| TW | 200421363 | A * | 10/2004 | ............... H01G 4/12 |
| TW | I229879 | B * | 3/2005 | |
| WO | WO-9918588 | A1 * | 4/1999 | ............. H01C 1/142 |
| WO | WO-2008035727 | A1 * | 3/2008 | ............. H01G 4/232 |

* cited by examiner

| CYCLE | | 250 | 500 | 750 | 1000 | 1500 |
|---|---|---|---|---|---|---|
| COMPARATIVE EXAMPLE | SUBSTRATE CRACK | 1/7 | 1/7 | - | - | - |
| | TERMINAL BREAKAGE | 0 | 1/7 | - | - | - |
| | SOLDER CRACK | - | 6/7 | 0 | 7/8 | - |
| EXAMPLE | SUBSTRATE CRACK | 0 | 0 | 0 | 0 | 0 |
| | TERMINAL BREAKAGE | 0 | 0 | 0 | 0 | 0 |
| | SOLDER CRACK | 1/7 | 2/7 | 3/7 | 7/7 | 7/7 | ns
LAMINATED ELECTRONIC COMPONENT WITH DIFFERING GLASS CONTENT ELECTRODES

CROSS REFERENCE TO RELATED APPLICATIONS

This application claims priority to Japanese Patent Application No. 2021-059936 filed on Mar. 31, 2021, the entire contents of which are incorporated by reference herein.

TECHNICAL FIELD

One aspect of the present disclosure relates to a laminated electronic component.

BACKGROUND

Japanese Unexamined Patent Publication No. 2020-61409 describes a laminated electronic component including an element body which is formed by laminating an insulating layer and has a bottom surface used as a mounting surface, and a bottom surface electrode which is formed on the bottom surface of the element body and contains glass and a sintered metal. The bottom surface electrode includes a first electrode layer and a second electrode layer formed on the element body side from the first electrode layer. In such a configuration, an edge portion of the second electrode layer is covered with an overcoat layer which is a part of the element body, and the first electrode layer is laminated on the second electrode layer with the overcoat layer interposed therebetween.

SUMMARY

In the above-described laminated electronic component, it is required to disperse stress from a stress concentration point and to suppress cracks in the element body by forming the bottom surface electrode in a two-layer structure including a first electrode layer and a second electrode layer. However, even if it is intended to disperse the stress, when an adhesive force of the first electrode layer to the element body is weak, the stress is applied to a structurally weak portion, and there arises a problem that damage such as plating peeling occurs on the electrode side.

One aspect of the present disclosure provides a laminated electronic component capable of suppressing generation of cracks in the element body and damage on the electrode side.

A laminated electronic component according to one aspect of the present disclosure includes an element body formed by laminating an insulating layer and having a bottom surface used as a mounting surface, and a bottom surface electrode formed on the bottom surface of the element body and containing glass and a sintered metal, wherein the bottom surface electrode includes a first electrode layer and a second electrode layer formed on the element body side from the first electrode layer, an edge portion of the second electrode layer is covered with an overcoat layer which is a part of the element body, the first electrode layer is laminated on the second electrode layer with the overcoat layer interposed therebetween, and a content of glass in the first electrode layer is larger than a content of glass in the second electrode layer.

In the laminated electronic component, the bottom surface electrode includes the first electrode layer and the second electrode layer formed on the element body side from the first electrode layer. The edge portion of the second electrode layer is covered with an overcoat layer which is a part of the element body. Meanwhile, the first electrode layer is laminated on the second electrode layer with the overcoat layer interposed therebetween. Here, the content of glass in the first electrode layer is larger than the content of glass in the second electrode layer. Therefore, the first electrode layer is bonded to the overcoat layer with high adhesion strength. Thus, when stress acts on the bottom surface electrode and the stress is concentrated in the vicinity of an end portion of the bottom surface electrode, the stress is dispersed in the overcoat layer through a boundary portion between the first electrode layer and the overcoat layer having high adhesion strength. As a result, it is possible to suppress generation of cracks in the element body and a damage on the electrode side.

A glass softening point of the first electrode layer may be lower than a glass softening point of the second electrode layer. In this case, when the first electrode layer is fired onto the element body, a firing temperature can be kept low, and thus a reaction of the first electrode layer with the element body can be suppressed.

In a cross-sectional view of a region in which the overcoat layer is sandwiched between the first electrode layer and the second electrode layer, when a direction in which the bottom surface electrode spreads is referred to as a first direction, and a direction along a thickness of the bottom surface electrode is referred to as a second direction, and a distance in the second direction between an end portion of the first electrode layer in the first direction and an end portion of the second electrode layer in the first direction is referred to as a first dimension, and a length in the first direction in which the second electrode layer is covered with the overcoat layer is referred to as a second dimension, the first dimension may be smaller than the second dimension, and the first dimension may be 10 µm or more. In this case, it is possible to sufficiently secure a stress dispersion region as described above.

The second electrode layer may be thicker than the first electrode layer. In this way, the first electrode layer having a high content of glass and high resistance can be kept thin by ensuring a thickness of the bottom surface electrode in the second electrode layer having a low content of glass and low resistance.

The content of glass in the first electrode layer may be 3.8 to 10.0 wt %. Within this range, the adhesion strength of the first electrode layer to the overcoat layer can be increased.

According to one aspect of the present disclosure, it is possible to provide a laminated electronic component capable of suppressing the generation of cracks in the element body and damage on the electrode side.

DETAILED DESCRIPTION

Figure 1:
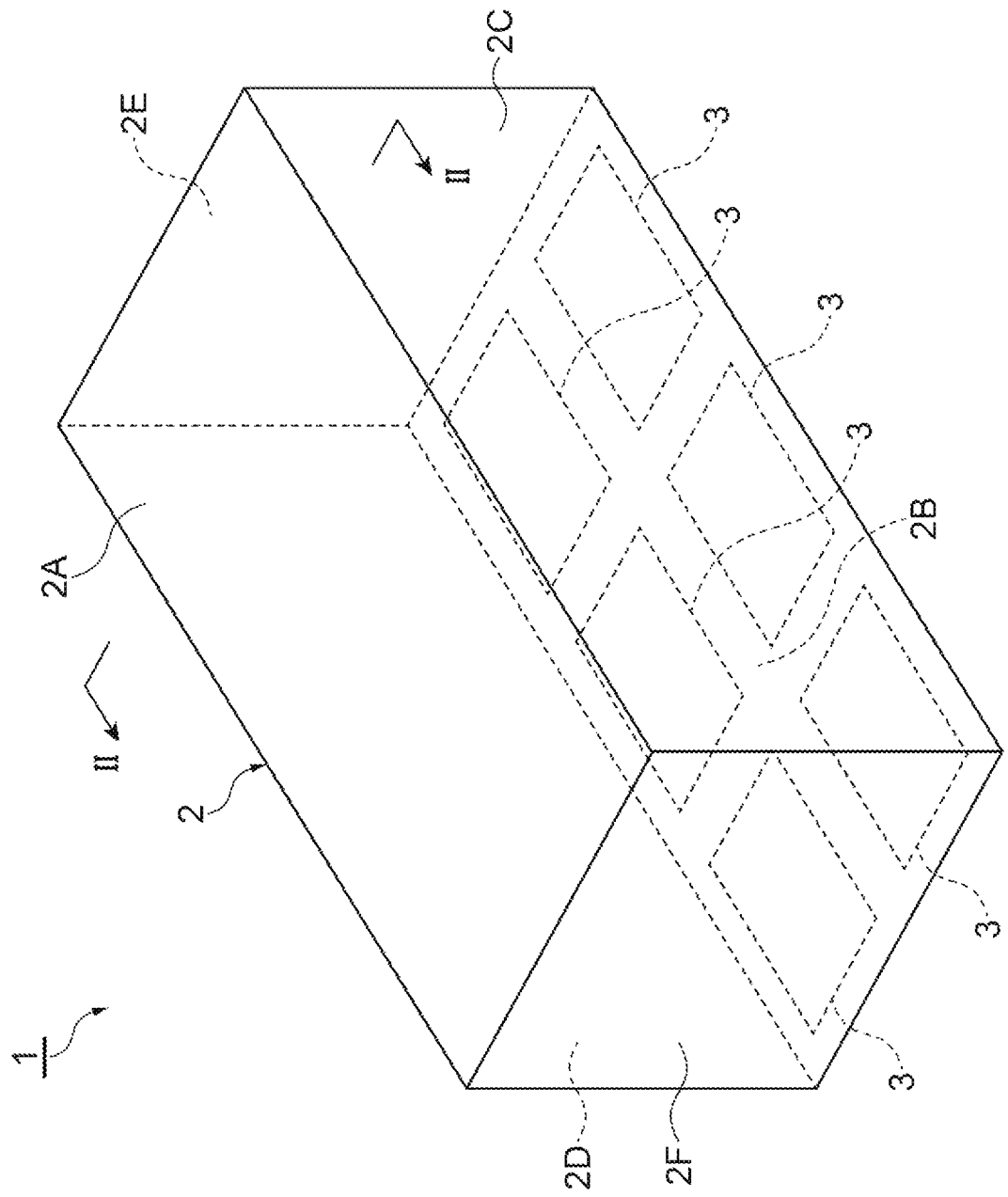
FIG. 1 is a perspective view of a laminated electronic component according to an embodiment of the present disclosure.

Hereinafter, an embodiment will be described in detail with reference to the accompanying drawings. In the description, the same reference numerals will be used for the same elements or elements having the same function, and duplicate description thereof will be omitted.

Figure 2:
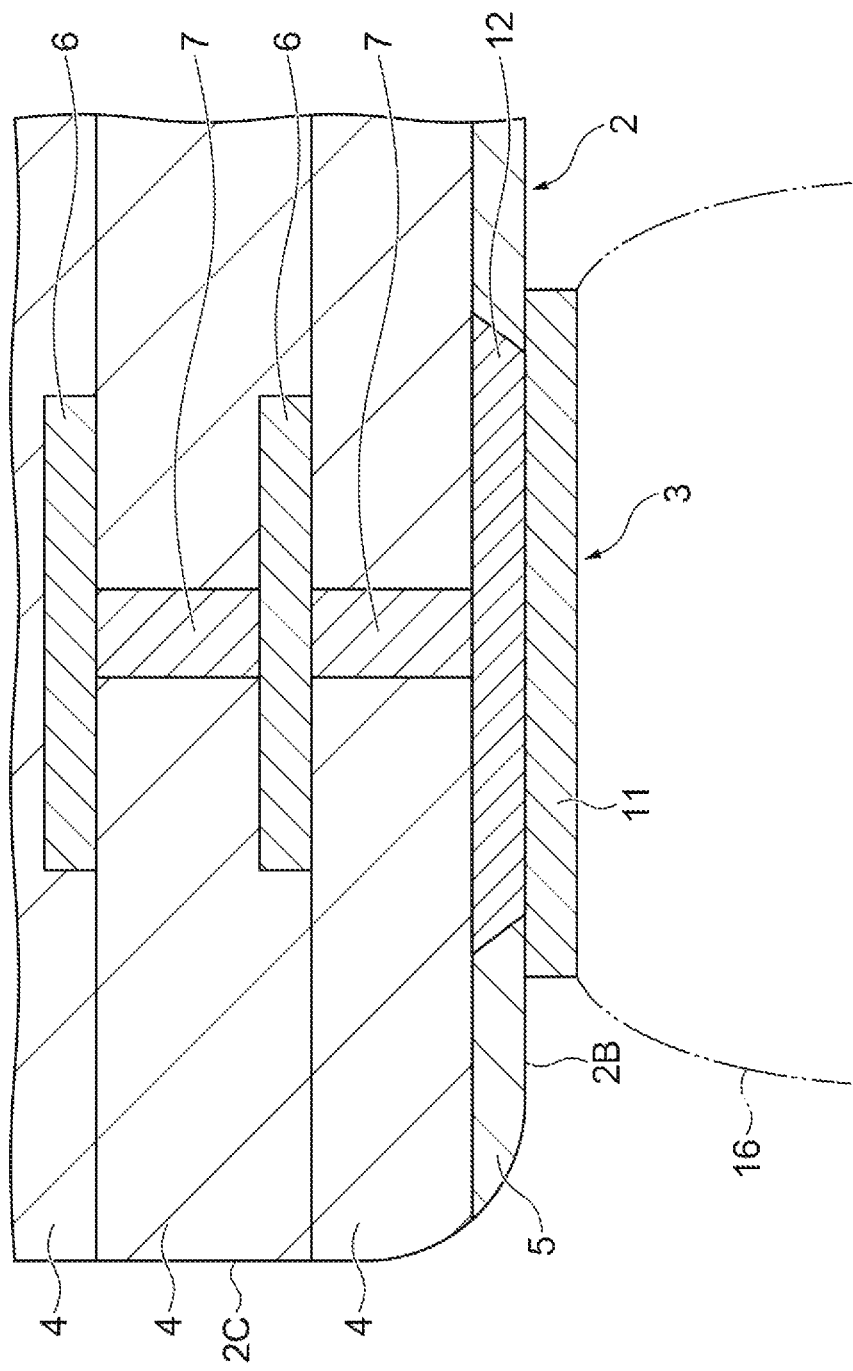
FIG. 2 is an enlarged cross-sectional view taken along line II-II illustrated in FIG. 1 in which the vicinity of a bottom surface electrode is enlarged.

FIG. 1 is a perspective view of a laminated electronic component 1 according to an embodiment of the present disclosure. FIG. 2 is an enlarged cross-sectional view taken along line II-II illustrated in FIG. 1 in which the vicinity of a bottom surface electrode 3 is enlarged. As illustrated in FIG. 1, the laminated electronic component 1 includes an element body 2 and a plurality of bottom surface electrodes 3.

As will be described below, the element body 2 is formed by laminating a plurality of insulating layers. The element body 2 has a rectangular parallelepiped shape. The rectangular parallelepiped shape includes a rectangular parallelepiped shape in which corner portions and ridge portions are chamfered, and a rectangular parallelepiped shape in which corner portions and ridge portions are rounded. The element body 2 has an upper surface 2A, a bottom surface 2B used as a mounting surface, and four side surfaces 2C, 2D, 2E, and 2F as outer surfaces thereof. The upper surface 2A and the bottom surface 2B face each other. The side surfaces 2C and 2D face each other. The side surfaces 2E and 2F face each other. The side surfaces 2C to 2F extend in a stacking direction of the upper surface 2A and the bottom surface 2B (a direction in which the insulating layers are laminated) and are adjacent to the upper surface 2A and the bottom surface 2B. In the element body 2, the upper surface 2A and the bottom surface 2B are located at both ends in the stacking direction. A material of the element body 2 (a material of the insulating layer) is not particularly limited, and for example, $Al_2O_3$, $SiO_2$, $2MgO \cdot SiO_2$, $xBaO \cdot yNdO \cdot zTiO_2$, $(Ca, Sr)TiO_2$ and the like may be adopted. In the specification, the terms "upper" and "bottom" are used for convenience of explanation, and do not limit a posture of the laminated electronic component 1 when the laminated electronic component 1 is used. For example, the laminated electronic component 1 may be mounted so that the upper surface 2A faces sideways or faces downward.

Figure 7C:
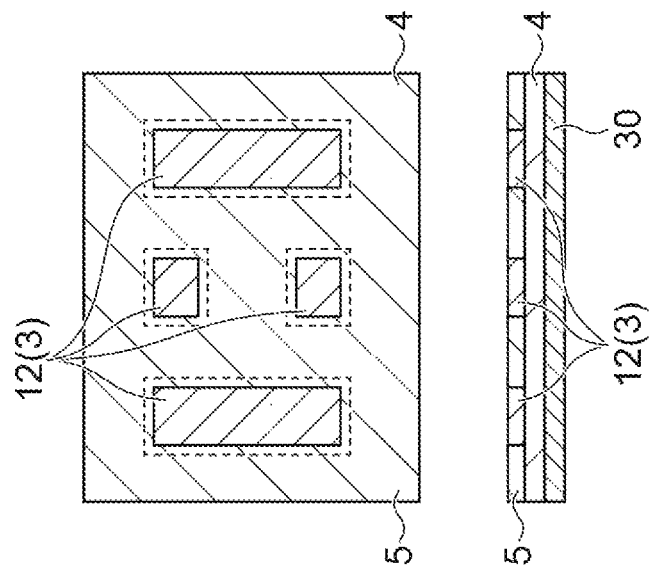
FIGS. 7A, 7B, and 7C are schematic views illustrating a state at each of stages of the method for manufacturing a laminated electronic component.
Figure 7B:
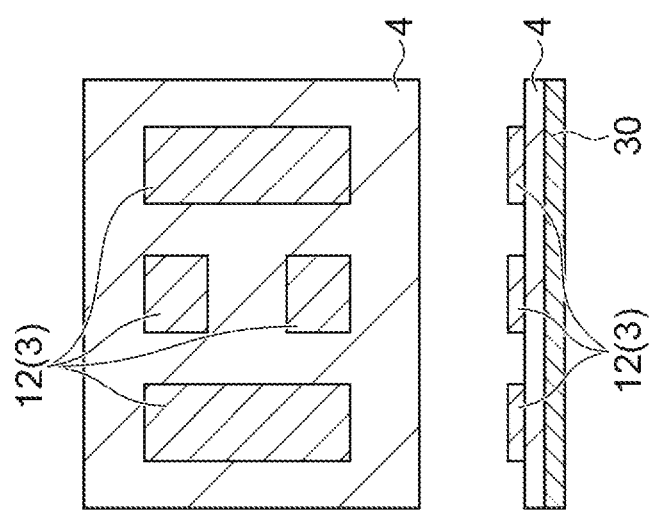
Figure 7A:
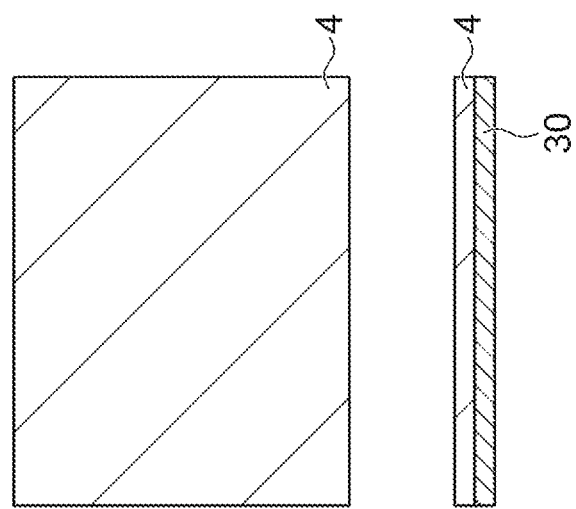
Figure 8C:
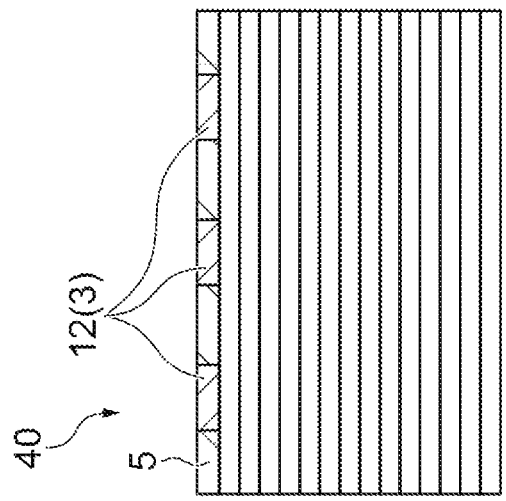
FIGS. 8A, 8B, and 8C are schematic views illustrating the state at each of stages of the method for manufacturing a laminated electronic component.
Figure 8B:
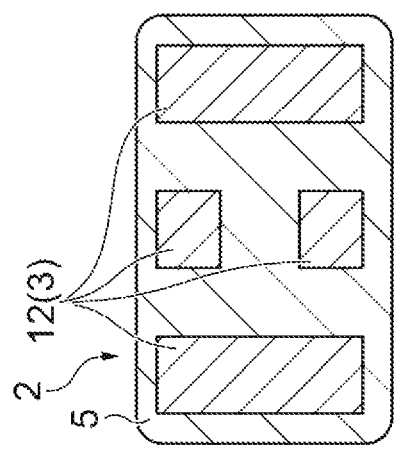
Figure 8A:
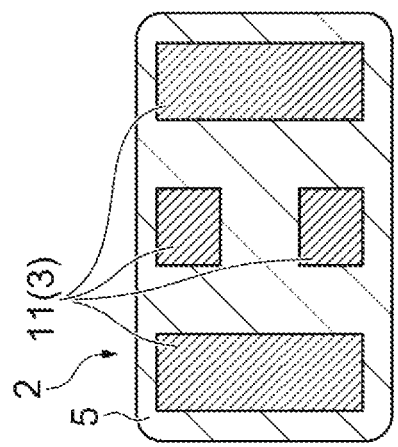
Figures 11A, 11B:
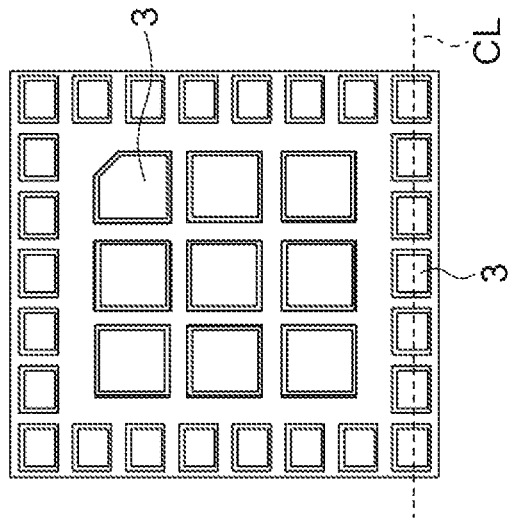
FIG. 11A is a bottom view illustrating a laminated electronic component used in a test.
FIG. 11B is a table illustrating test results.

The bottom surface electrode 3 is an electrode provided on the bottom surface 2B of the element body 2. The bottom surface electrode 3 has a rectangular shape when seen in the stacking direction. In the example illustrated in FIG. 1, six bottom surface electrodes 3 are formed. The bottom surface electrodes 3 have the same shape as each other. The number of bottom surface electrodes 3 may be appropriately changed according to the use of the laminated electronic component 1. Further, shapes of the plurality of bottom surface electrodes do not have to be the same as each other. For example, as illustrated in FIGS. 7A, 7B and 7C, four bottom surface electrodes 3 having two different sizes may be formed, or as illustrated in FIGS. 11A and 11B, a large number of bottom surface electrodes 3 may be formed.

As illustrated in FIG. 2, the element body 2 is configured by laminating the plurality of insulating layers 4. Further, a plurality of internal electrodes 6 and through hole conductors 7 are formed inside the element body 2. The element body 2 is formed by laminating a sheet of the insulating layer 4 having a conductor pattern of the internal electrode 6 formed on a surface thereof and then baking the sheet. The through hole conductor 7 is a conductor which passes through the insulating layer 4 per sheet and connects the internal electrodes 6 formed in other insulating layers 4. Further, the through hole conductor 7 connects the internal electrode 6 to the bottom surface electrode 3. A boundary portion between the insulating layers 4 is integrated to an extent that the boundary portion cannot be visually recognized. The element body 2 has an overcoat layer 5 at a position of the bottom surface 2B as one of the insulating layers. The overcoat layer 5 will be described below together with a configuration of the bottom surface electrode 3.

Figure 3:
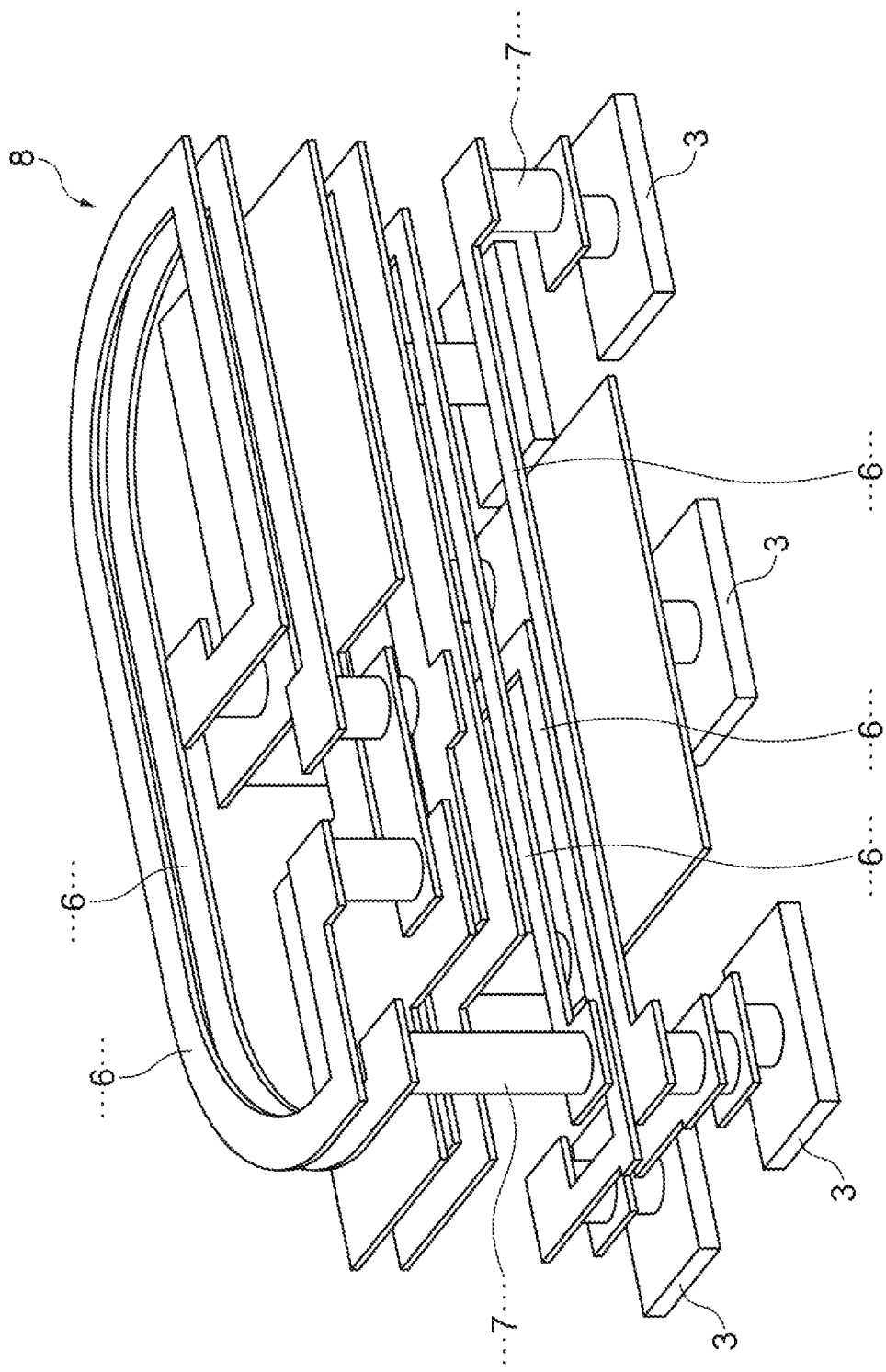
FIG. 3 illustrates an example of a structure of an internal electrode and a through hole conductor inside an element body.

FIG. 3 shows an example of a structure of the internal electrode 6 and the through hole conductor 7 inside the element body 2. As illustrated in FIG. 3, inside the element body 2, a plurality of internal electrodes 6 and a plurality of through hole conductors are three-dimensionally combined to form an electric circuit 8 exhibiting a predetermined function. In FIG. 3, an electric circuit 8 of a directional coupler is illustrated as an example. Each of the plurality of bottom surface electrodes 3 is electrically connected to the electric circuit 8. Thus, the electric circuit 8 and an external mounting substrate are connected via the bottom surface electrode 3 by connecting the bottom surface electrode 3 to the external mounting substrate.

Figure 4:
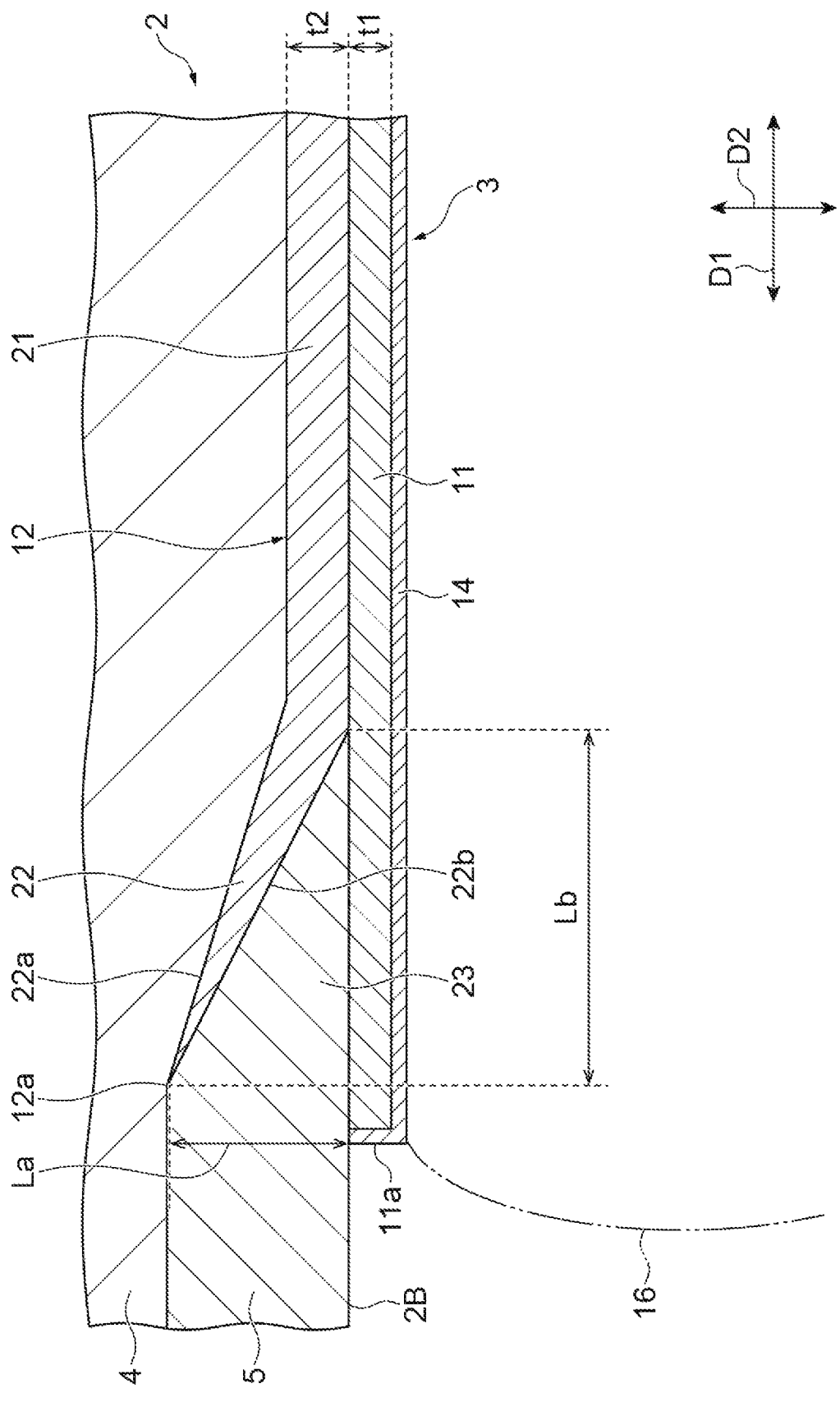
FIG. 4 is an enlarged cross-sectional view of an end portion of the bottom surface electrode.

Next, a configuration of the bottom surface electrode 3 will be described in detail. As illustrated in FIG. 4, the bottom surface electrode 3 includes a first electrode layer 11 and a second electrode layer 12. The first electrode layer 11 is a layer formed to be exposed to the outside from the bottom surface 2B. The first electrode layer 11 is formed by firing a conductive material on the element body 2 (and the second electrode layer 12) after the element body 2 is baked. The first electrode layer 11 is a layer which is electrically connected to the external mounting substrate via a solder 16. Therefore, a plating layer 14 for improving wettability of the solder is formed on an outer surface of the first electrode layer 11. The second electrode layer 12 is a layer formed on the element body 2 side from the first electrode layer 11. The second electrode layer 12 is formed in such a manner that it slips into the inside of the element body 2 and is formed by baking at the same time as the element body 2.

In the following description, in a cross-sectional view illustrated in FIG. 4, a direction in which the bottom surface electrode 3 spreads may be referred to as a first direction D1, and a direction along a thickness of the bottom surface electrode 3 may be referred to as a second direction D2.

The second electrode layer 12 has a main body portion 21 which expands in the first direction D1 and an edge portion 22 formed on the outer peripheral side in the first direction D1. The edge portion 22 of the second electrode layer 12 is covered with the overcoat layer 5 which is a part of the element body 2. An upper surface 22a of the edge portion 22 in the second direction D2 comes into contact with the insulating layer 4 of the element body 2. A bottom surface 22b of the edge portion 22 in the second direction D2 comes into contact with the overcoat layer 5 of the element body 2. In this way, the edge portion 22 slips into the inside of the element body 2 in such a manner that it is sandwiched between the insulating layer 4 and the overcoat layer 5. The edge portion 22 is formed so as to be inclined upward and tapered in the second direction D2 from the main body portion 21 toward the outer peripheral side in the first direction D1. Therefore, the bottom surface 22b of the edge portion 22 goes away upward from the bottom surface 2B as it goes away from the main body portion 21 in the first direction D1.

With the above-described configuration, a thickness of the overcoat layer 5 in contact with the surface 22b of the edge portion 22 increases from the main body portion 21 toward the outer peripheral side in the first direction D1. As described above, the overcoat layer 5 has a region in which the overcoat layer 5 slips into the bottom side of the edge portion 22 and supports the surface 22a. The region constitutes a covering portion 23 which covers the edge portion 22. The covering portion 23 tapers toward the main body portion 21 in the second direction D2. The main body portion 21 of the second electrode layer 12 is configured to be exposed from the covering portion 23. The upper surface 22a and the bottom surface 22b intersect each other at a position of an end portion 12a of the second electrode layer 12 in the first direction D1.

Figure 5A:
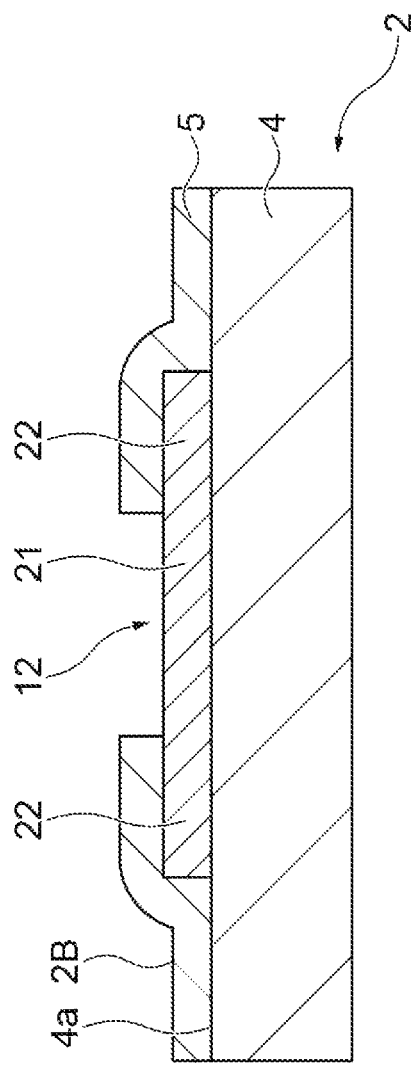
FIGS. 5A and 5B are conceptual diagrams illustrating a manufacturing process of a second electrode layer.
Figure 5B:
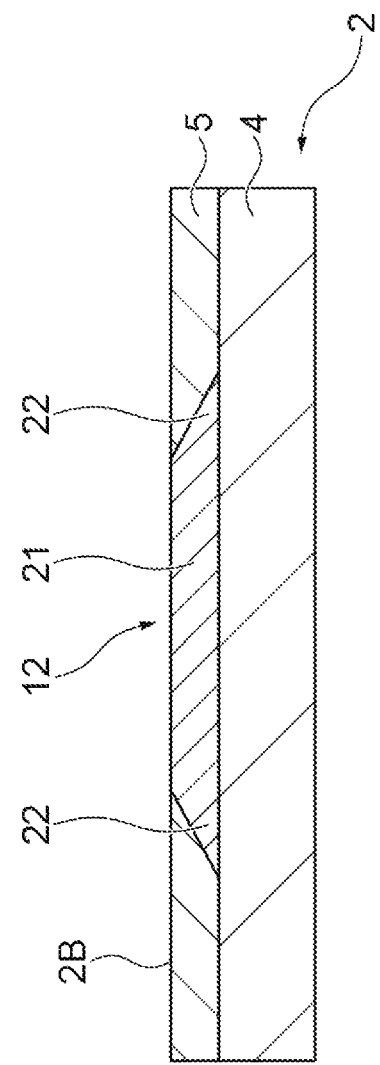

Shapes of the second electrode layer 12 and the overcoat layer 5 are formed by, for example, a manufacturing method as illustrated in FIGS. 5A and 5B. First, as illustrated in FIG. 5A, a paste of the second electrode layer 12 is printed on an outer surface 4a of the outermost insulating layer 4 before baking. Next, the paste of the overcoat layer 5 is printed on the outer surface 4a of the insulating layer 4 to cover the edge portion 22 of the second electrode layer 12 and to expose the main body portion 21. Then, as illustrated in FIG. 5B, the edge portion 22 is crushed by the overcoat layer 5 and becomes tapered by pressing the second electrode layer 12 and the overcoat layer 5.

As illustrated in FIG. 4, the first electrode layer 11 is laminated on the second electrode layer 12 with the overcoat layer 5 interposed therebetween. As described above, the overcoat layer 5 covers the edge portion 22 of the second electrode layer 12 in the covering portion 23. The first electrode layer 11 is formed to cover the main body portion 21 of the second electrode layer 12 and the outer surface (that is, the bottom surface 2B) of the overcoat layer 5 from the bottom side. Therefore, the covering portion 23 of the overcoat layer 5 is disposed to be sandwiched between the bottom surface 22b of the edge portion 22 of the second electrode layer 12 and the first electrode layer 11.

Next, a dimensional relationship of the bottom surface electrode 3 will be described. A distance in the second direction D2 between an end portion 11a of the first electrode layer 11 in the first direction D1 and the end portion 12a of the second electrode layer 12 in the first direction D1 is referred to as a first dimension La. Further, a length in the first direction D1 in which the second electrode layer 12 is covered with the overcoat layer 5 is referred to as a second dimension Lb. In FIG. 4, since the first electrode layer 11 expands substantially parallel to the first direction, positions of the end portion 11a and the other portion in the second direction D2 are the same. However, the position of the end portion 11a may be different from that of the other portion of the first electrode layer 11 in the second direction. A dimension of the first electrode layer 11 in the second direction D2 is referred to as a thickness t1. A dimension of the main body portion 21 of the second electrode layer 12 in the second direction D2 is referred to as a thickness t2.

In this case, the first dimension La is smaller than the second dimension Lb. Further, the first dimension La is preferably 10 μm or more, and more preferably 15 μm or more. Further, the first dimension La is preferably 60 μm or less, and more preferably 40 μm or less. The second dimension Lb is preferably 20 μm or more, and more preferably 25 μm or more. The second dimension Lb is preferably 90 μm or less, and more preferably 60 μm or less. The thickness t2 of the second electrode layer 12 is thicker than the thickness t1 of the first electrode layer 11. Further, the thickness t1 of the first electrode layer 11 is preferably 3 μm or more, and more preferably 5 μm or more. Further, the thickness t1 of the first electrode layer 11 is preferably 30 μm or less, and more preferably 20 μm or less. Further, the thickness t2 of the second electrode layer 12 is preferably 5 μm or more, and more preferably 20 μm or more. Further, the thickness t2 of the second electrode layer 12 is preferably 40 μm or less, and more preferably 30 μm or less.

Next, a material of the bottom surface electrode 3 will be described. The bottom surface electrode 3 is made of a conductive material including glass and a sintered metal. Examples of the sintered metal include Ag, Cu, Au, Pt, Pd, and alloys thereof. The sintered metal contained in the first electrode layer 11 and the sintered metal contained in the second electrode layer 12 may be different from each other or may be the same as each other. Further, the bottom surface electrode 3 may contain a trace metal oxide as another inorganic component.

A content of glass in the first electrode layer 11 is higher than that in the second electrode layer 12. Specifically, the content of glass in the first electrode layer 11 is preferably 3.8 wt % or more, and more preferably 5.0 wt % or more. The content of glass in the first electrode layer 11 is preferably 8.0 wt % or less, and more preferably 10.0 wt % or less. The content of glass in the second electrode layer 12 is preferably 0.5 wt % or more, and more preferably 1.0 wt % or more. The content of glass in the second electrode layer 12 is preferably 2.8 wt % or less, more preferably 2.5 wt % or less.

A glass softening point of the first electrode layer 11 is lower than a glass softening point of the second electrode layer 12. Specifically, the glass softening point of the first electrode layer 11 is 540 to 670° C. High denseness (electrical characteristics of a product, suppression of intrusion of a plating solution, and the like) of the electrode can be maintained as a baked electrode, and also plating properties can be achieved by increasing the content of glass and lowering the softening point. The glass softening point of the second electrode layer 12 is 810 to 860° C. In this way, sintering matching with the element body 2 can be obtained by increasing the softening point of the second electrode layer 12 and reducing an addition amount of glass. The sintering matching is to achieve both an effect of suppressing bending of the element body 2 and the high denseness of the electrode.

Figure 6:
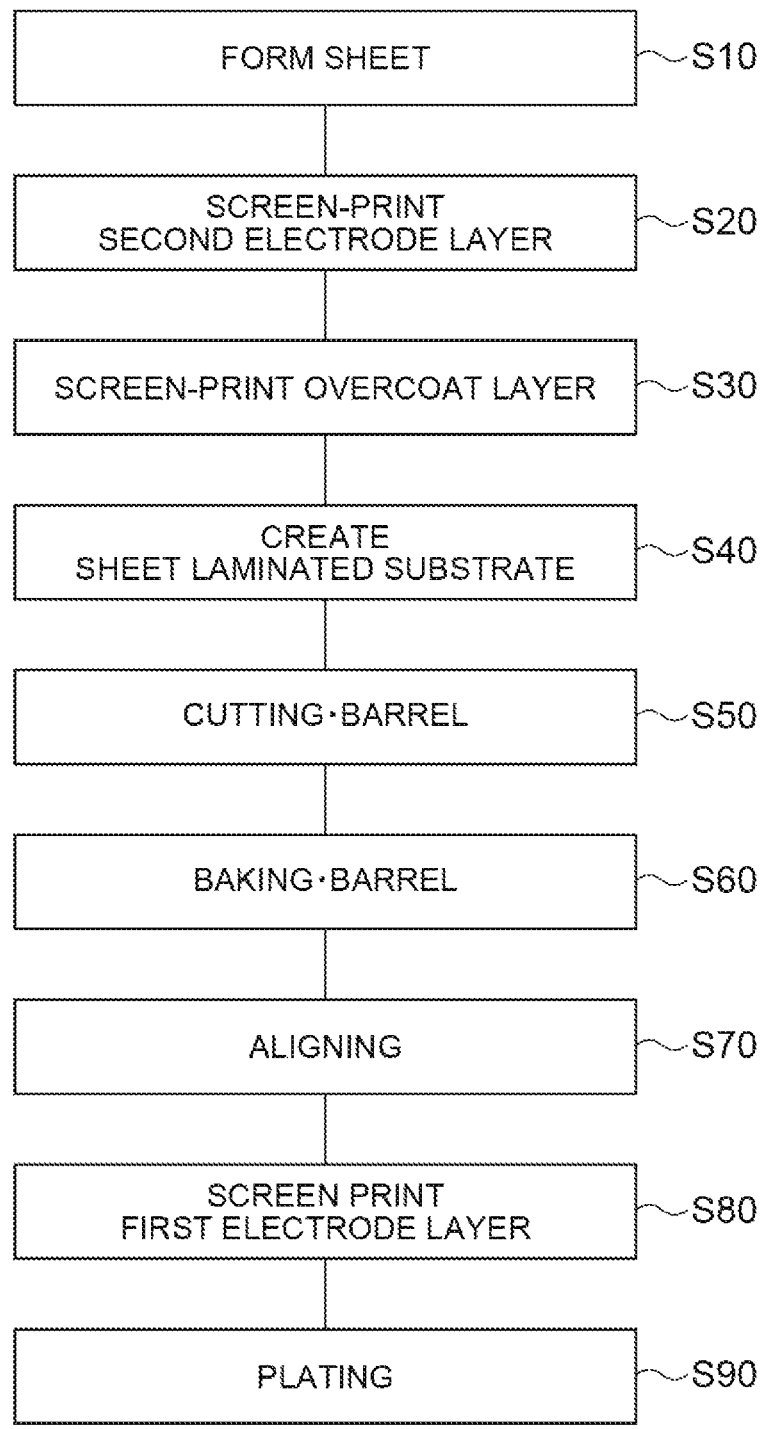
FIG. 6 is a process diagram illustrating a method for manufacturing a laminated electronic component.

Next, a method for manufacturing the laminated electronic component 1 will be described with reference to FIGS. 6 to 8A, 8B, and 8C. FIG. 6 is a process diagram illustrating the method for manufacturing the laminated electronic component 1. FIGS. 7A, 7B, 7C, 8A, 8B, and 8C are schematic views illustrating a state at each of stages of the method for manufacturing the laminated electronic component 1. FIGS. 7A, 7B, 7C, 8A, 8B, and 8C illustrate an example of a case of four bottom surface electrodes 3. The upper views of FIGS. 7A, 7B and 7C illustrate plan views, and the lower views illustrate side views.

As illustrated in FIG. 6, first, a process of forming a sheet of the insulating layer 4 is performed (Step S10). In this process, the sheet is formed by applying a paste constituting the insulating layer 4 onto a base sheet 30 such as a PET film (refer to FIG. 7A). Next, a process of forming the second electrode layer 12 of the bottom surface electrode 3 by performing screen printing on the sheet of the insulating layer 4 is performed (Step S20). In this process, the paste is printed on the outer surface of the insulating layer 4 by the screen printing in a shape corresponding to the second electrode layer 12 (refer to FIG. 7B). At this timing, the internal electrode 6 is printed on the sheet of the other insulating layer 4. Next, a process of forming the overcoat layer 5 by performing screen printing on the outer surface of the insulating layer 4 is performed (Step S30). In this process, the paste is printed on the outer surface of the insulating layer 4 by the screen printing in a shape corresponding to the overcoat layer 5 (refer to FIG. 7C). At this time, the overcoat layer 5 is printed to cover the edge portion of the second electrode layer 12 and is pressed after the printing (refer to FIGS. 5A and 5B).

Next, a process of creating a sheet laminated substrate 40, which is the element body 2 before sintering, by laminating the sheet of the insulating layer 4 after the printing is performed (Step S40). In the sheet laminated substrate 40, each of the insulating layers 4 is laminated so that the overcoat layer 5 is the outermost layer (refer to FIG. 8A). Next, a process of cutting the sheet laminated substrate 40 to a predetermined size with a dicer and performing chamfering with a green barrel is performed (Step S50). Next, a process of sintering the sheet laminated substrate 40 to create the element body 2 and performing a barrel treatment after baking is performed (Step S60). Due to these processes, the element body 2 having an angle R formed is formed (refer to FIG. 8B). Next, a process of aligning the element body 2 for screen printing is performed (Step S70). Then, a process of forming the first electrode layer 11 by performing screen printing on the element body 2 is performed (Step S80). In this process, a process of forming the first electrode layer 11 by screen printing to cover the second electrode layer 12 is performed (refer to FIG. 8C). The first electrode layer 11 is formed by a heat treatment for firing. Next, a process of forming the plating layer 14 by subjecting the outer surface of the first electrode layer 11 to a plating treatment is performed (Step S90).

Next, an operation and effect of the laminated electronic component 1 according to the present embodiment will be described.

Figure 9A:
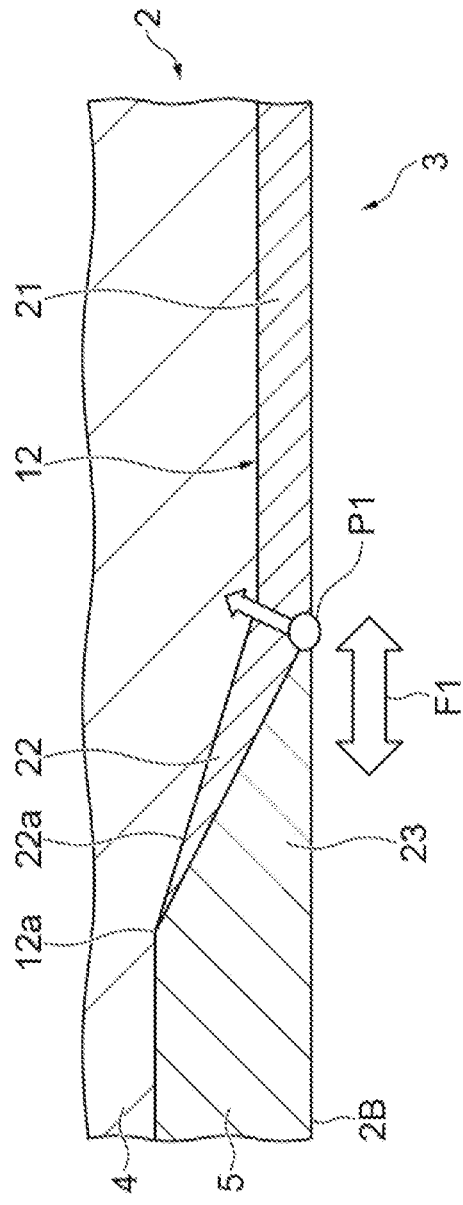
FIG. 9A is an enlarged cross-sectional view illustrating a state of stress in a laminated electronic component according to a comparative example.

First, a laminated electronic component according to a comparative example illustrated in FIG. 9A will be described. In the comparative example, the first electrode layer 11 is not formed. In this case, when the laminated electronic component is mounted, stress F1 acts on the bottom surface electrode 3 due to an influence of heat. Then, the stress is concentrated on a portion P1 between the bottom surface 2B of the element body 2 and the second electrode layer 12. As a result, stress F2 moves from the portion P1 on which the stress is concentrated to the inside of the element body 2. When such stress F2 acts in a high cycle, cracks are generated in the element body 2.

Figure 9B:
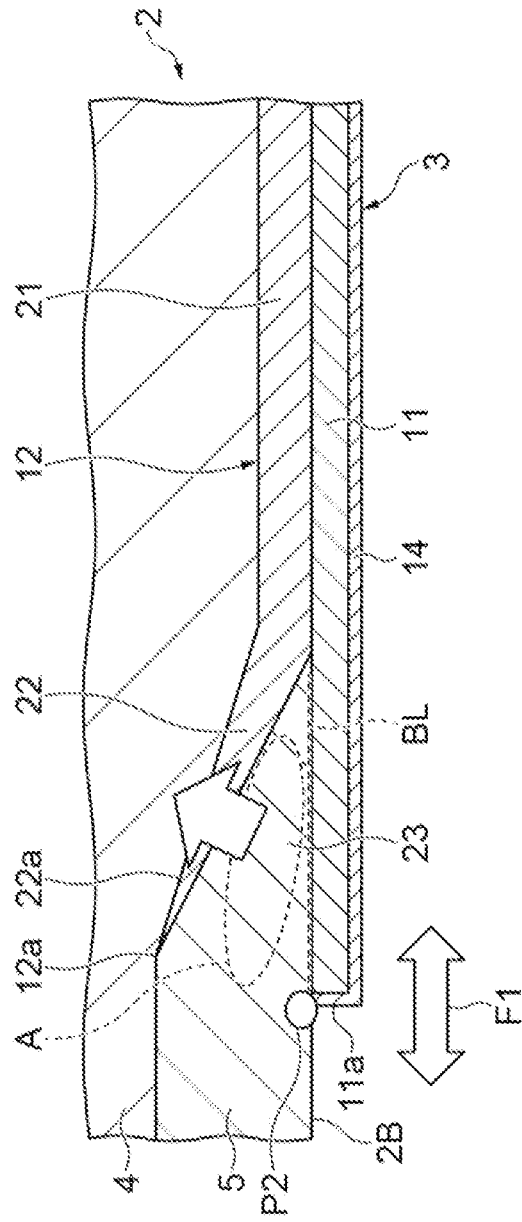
FIG. 9B is an enlarged cross-sectional view illustrating a state of stress in a laminated electronic component according to the present embodiment.

In the laminated electronic component 1, the bottom surface electrode 3 includes the first electrode layer 11 and the second electrode layer 12 formed on the element body 2 side from the first electrode layer 11. The edge portion 22 of such a second electrode layer 12 is covered with the overcoat layer 5 which is a part of the element body 2. Meanwhile, the first electrode layer 11 is laminated on the second electrode layer 12 with the overcoat layer 5 interposed therebetween. In such a structure, as illustrated in FIG. 9B, the stress F1 acts on the bottom surface electrode 3, and the stress is concentrated on a portion P2 in the vicinity of the end portion of the bottom surface electrode 3. For example, when the first electrode layer 11 is not in close contact with the overcoat layer 5 with sufficient adhesion strength, the stress cannot be satisfactorily dispersed in the overcoat layer 5, and cracks may be generated in the element body 2. Alternatively, the bottom surface electrode 3 itself may be damaged, such as peeling of the plating layer 14. On the other hand, in the laminated electronic component 1 according to the present embodiment, the content of glass in the first electrode layer 11 is larger than the content of glass in the second electrode layer 12. Therefore, the first electrode layer 11 is bonded to the overcoat layer 5 with high adhesion strength. Therefore, as illustrated in FIG. 9B, when the stress F1 acts on the bottom surface electrode 3 and the stress is concentrated on the portion P2 in the vicinity of the end portion of the bottom surface electrode 3, the stress is distributed to the covering portion 23 (a region surrounded by A in the drawing) of the overcoat layer 5 via a boundary portion BL having high adhesion strength between the first electrode layer 11 and the overcoat layer 5. As a result, it is possible to suppress the generation of cracks in the element body 2 and the damage on the electrode side.

The glass softening point of the first electrode layer 11 may be lower than the glass softening point of the second electrode layer 12. In this case, when the first electrode layer 11 is fired onto the element body 2, a firing temperature can be suppressed to a low level, and thus a reaction of the first electrode layer 11 with the element body 2 can be suppressed.

Figure 10A:
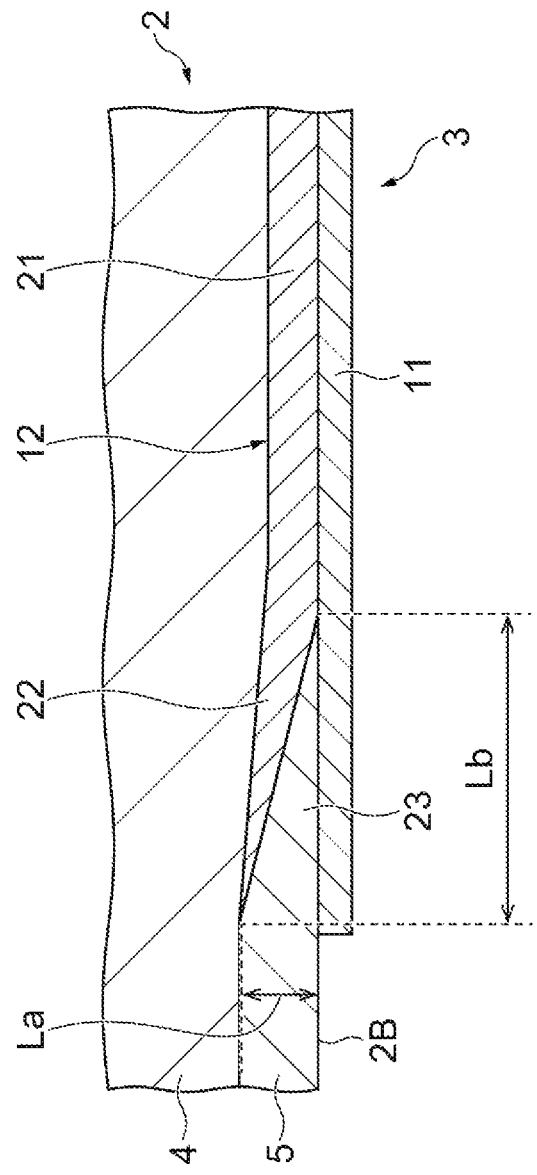
FIGS. 10A and 10B are enlarged cross-sectional views for describing an effect of a dimensional relationship between a first electrode layer and a second electrode layer.
Figure 10B:
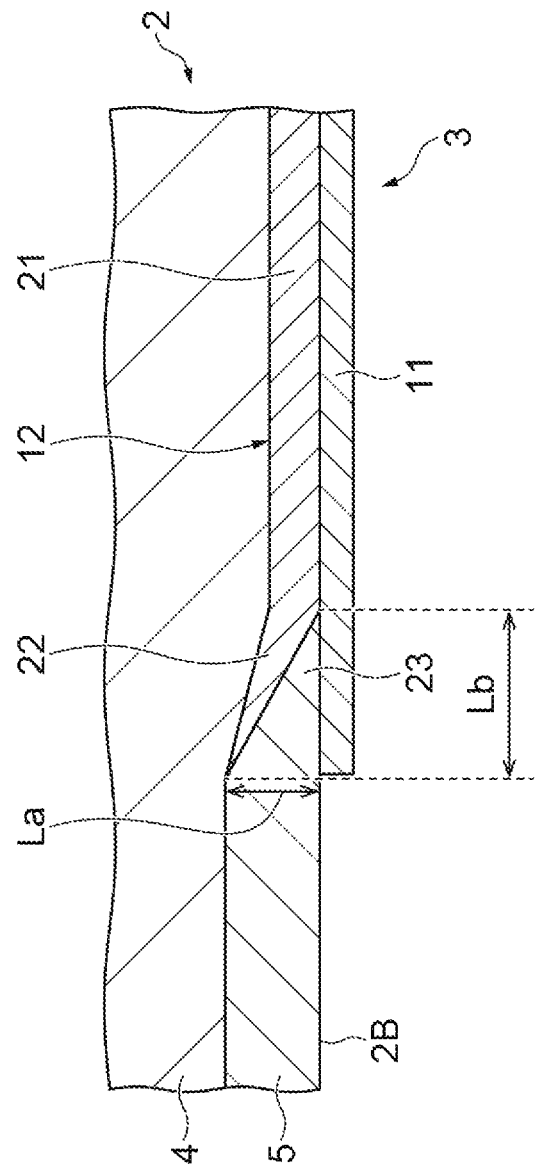

In a cross-sectional view of a region in which the overcoat layer 5 is sandwiched between the first electrode layer 11 and the second electrode layer 12, when a direction in which the bottom surface electrode 3 expands is referred to as the first direction D1, and the direction along the thickness of the bottom surface electrode 3 is referred to as the second direction D2, and the distance in the second direction D2 between the end portion 11a of the first electrode layer 11 in the first direction D1 and the end portion 12a of the second electrode layer 12 in the first direction D1 is referred to as the first dimension La, and the length in the first direction D1 in which the second electrode layer 12 is covered with the overcoat layer 5 is the second dimension Lb, the first dimension La may be smaller than the second dimension Lb, and the first dimension La may be 10 μm or more. In this case, it is possible to sufficiently secure a stress dispersion region as described above. For example, as illustrated in FIG. 10A, when the first dimension La is too short, the stress distribution to the covering portion 23 may be insufficient. Further, as illustrated in FIG. 10B, when the second dimension Lb is too short, the stress distribution to the covering portion 23 may be insufficient. On the other hand, as illustrated in FIG. 4, the effect of distributing stress to the covering portion 23 can be sufficiently obtained by setting the first dimension La and the second dimension Lb to appropriate dimensions.

The second electrode layer 12 may be thicker than the first electrode layer 11. As described above, the first electrode layer 11 having a high content of glass and high resistance can be thinly suppressed by ensuring the thickness of the bottom surface electrode 3 in the second electrode layer 12 having a low content of glass and low resistance.

The content of glass in the first electrode layer 11 may be 3.8 to 10.0 wt %. Within this range, the adhesion strength of the first electrode layer 11 to the overcoat layer 5 can be increased.

Next, with reference to FIGS. 11A and 11B, a thermal shock test for the laminated electronic components according to the example and the comparative example will be described. A laminated electronic component having a pattern of the bottom surface electrode 3 as illustrated in FIG. 11A was prepared. As the laminated electronic component according to the comparative example, as illustrated in FIG. 9A, a laminated electronic component in which the first electrode layer 11 is omitted was prepared. The laminated electronic components according to the comparative example and the example are connected to a substrate via solders, and temperature is repeatedly raised and lowered at −40° C. to 125° C. At this time, the components are held at each temperature for 30 minutes. A thermal shock test was carried out under such conditions. Cutting is performed at a cutting line CL of FIG. 11A, generation of substrate cracks (cracks in the element body 2), terminal breakage (peeling from the bottom surface electrode of the plating layer, and the like), and solder cracks were observed for seven bottom surface electrodes. The number of defective bottom surface electrodes out of 7 was counted. Test results are illustrated in FIG. 11B.

As illustrated in FIG. 11B, in the comparative example, the substrate cracks and the terminal breakages were confirmed in a small number of cycles. As the substrate cracks, cracks which extend upward from the portion P1 on which stress is concentrated and destroy the second electrode layer 12 and the insulating layer 4 (refer to FIGS. 9A, and 9B), and cracks which extend upward from the portion P1 so that the second electrode layer 12 is destroyed and extend along a boundary portion between the second electrode layer 12 and the insulating layer 4 were observed. As the terminal breakage, peeling between the electrode and the plating was confirmed. In addition, it was confirmed that solder cracks were generated in 6 out of 7 bottom surface electrodes in 500 cycles. As the solder cracks, cracks which destroy the inside of the solder were confirmed. On the other hand, in the example, it was confirmed that the substrate crack and the terminal breakage could be prevented even with a high number of cycles. It was also confirmed that the generation of solder cracks could be suppressed at a low number of cycles.

EXPLANATION OF REFERENCES

1 Laminated electronic component
2 Element body
3 Bottom surface electrode
5 Overcoat layer
11 First electrode layer
12 Second electrode layer

What is claimed is:

1. A laminated electronic component comprising:
an element body formed by laminating an insulating layer and having a bottom surface used as a mounting surface; and
a bottom surface electrode formed on the bottom surface of the element body and containing glass and a sintered metal,
wherein the bottom surface electrode includes a first electrode layer and a second electrode layer formed on the element body side from the first electrode layer,
an edge portion of the second electrode layer is covered with an overcoat layer which is a part of the element body,
the first electrode layer is laminated on the second electrode layer with the overcoat layer interposed therebetween, and
a content of glass in the first electrode layer is larger than a content of glass in the second electrode layer.

2. The laminated electronic component according to claim 1, wherein a glass softening point of the first electrode layer is in a range of 540 to 670° C. and a glass softening point of the second electrode layer is in a range of 810 to 860° C.

3. The laminated electronic component according to claim 1, wherein, in a cross-sectional view of a region in which the overcoat layer is sandwiched between the first electrode layer and the second electrode layer, when a direction in which the bottom surface electrode expands is referred to as a first direction, and a direction along a thickness of the bottom surface electrode is referred to as a second direction, and
a distance in the second direction between an end portion of the first electrode layer in the first direction and an end portion of the second electrode layer in the first direction is referred to as a first dimension, and
a length in the first direction in which the second electrode layer is covered with the overcoat layer is referred to as a second dimension,
the first dimension is smaller than the second dimension, and the first dimension is 10 μm or more.

4. The laminated electronic component according to claim 1, wherein the second electrode layer is thicker than the first electrode layer.

5. The laminated electronic component according to claim 1, wherein the content of glass in the first electrode layer is 3.8 to 10.0 wt %.

* * * * *